Sept. 2, 1952 J. M. HOLLYWOOD 2,609,490

AUTOMATIC TUNING CONTROL

Filed Jan. 7, 1946 2 SHEETS—SHEET 1

INVENTOR
JOHN M. HOLLYWOOD
BY
William D. Hall
ATTORNEY

Sept. 2, 1952 J. M. HOLLYWOOD 2,609,490

AUTOMATIC TUNING CONTROL

Filed Jan. 7, 1946 2 SHEETS—SHEET 2

INVENTOR
JOHN M. HOLLYWOOD
BY
William D. Hall
ATTORNEY

Patented Sept. 2, 1952

2,609,490

UNITED STATES PATENT OFFICE 2,609,490

AUTOMATIC TUNING CONTROL

John M. Hollywood, Washington, D. C., assignor to the United States of America as represented by the Secretary of War Application January 7, 1946, Serial No. 639,652

2 Claims. (Cl. 250—17)

This invention relates generally to electrical apparatus and more particularly to a means for automatically tuning a resonant tank circuit to a particular frequency.

In one application contemplated by the present invention, a parallel resonant circuit, hereinafter referred to as a tank circuit, is used in the output stage of a radio frequency transmitter. When the radio frequency transmitter is installed in an aircraft, its antenna may be of the electrically-short, trailing wire type, and the tuning of the tank circuit to a particular frequency becomes rather critical because of the small antenna impedance.

In one method of tuning a tank circuit, the capacitive branch is made variable and an adjustment is anticipated whereby the impedance offered by the tank circuit to an applied potential of a particular frequency is theoretically infinite and the line current flowing through the circuit is a minimum. When the radio frequency transmitter is installed in an aircraft, it may not be practical or even possible to perform the tuning operations by manual means. Accordingly, it is an object of this invention to provide an automatic tuning system for adjusting the resonant frequency of a tank circuit to the particular frequency of a signal applied thereto.

Other objects, features and advantages of this invention will suggest themselves to those skilled in the art, and will become apparent from the following description of the invention taken in connection with the accompanying drawings in which.

The automatic tuning system disclosed in this application provides a means for continuously monitoring the tuning adjustment of a tank circuit. The monitoring involves a continuous process of detuning the tank circuit slightly and utilizing the resultant change in line current flowing through the tank circuit to retune the circuit so that it becomes resonant at a particular frequency which is applied thereto, and thereby to minimize the line current.

The detuning process may be accomplished by switching between two tuning settings of the resonant tank circuit. It may also be accomplished by varying the tuning of the tank circuit continuously in a cyclic manner between two values of frequency.

Figure 1:
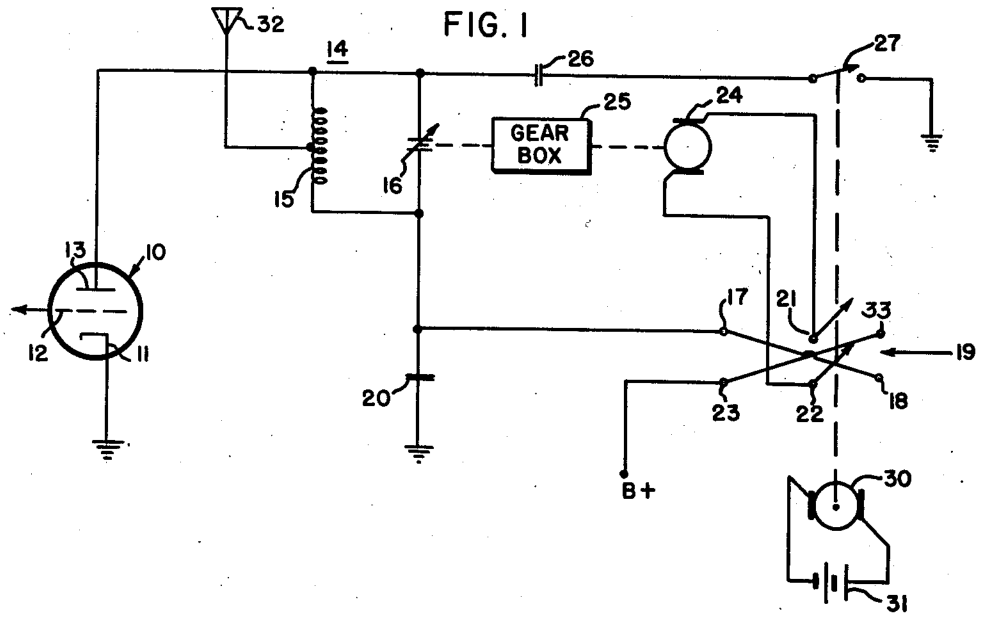
Fig. 1 is a schematic diagram of one embodiment of electrical apparatus entailing the principles of this invention.

One embodiment of this invention in which the tuning of a resonant circuit is switched between two values and the change in current is simultaneously monitored is shown in Fig. 1. A portion of the output circuit of a radio frequency transmitter is shown, vacuum tube 10 being in the output stage. Cathode 11 of vacuum tube 10 is at ground potential. Control grid 12 receives the radio frequency output of a preceding stage such as the modulator in the radio frequency transmitter.

Anode 13 of vacuum tube 10 is connected to one end of a tank circuit 14. Tank circuit 14 includes a center-tapped inductance 15 in parallel with a variable condenser 16. The center tap of inductance 15 is connected to a suitable radiating means, designated herein as antenna 32. The opposite end of tank circuit 14 is connected to terminal 17 and terminal 18 of reversing switch 19, and is also bypassed to ground for radio frequency potentials through bypass condenser 20.

Reversing switch 19 may be a double-pole, double-throw switch in which the two common poles 21 and 22 are in contact with terminals 17 and 23, respectively, or alternatively with terminals 33 and 18, respectively. Terminals 17 and 18 are diagonally opposite to each other and are electrically connected together. Terminals 23 and 33 are diagonally opposite to each other and are electrically connected together.

To terminal 23 is applied a suitable positive potential from a source designated herein as B+. Common poles 21 and 22 are connected to motor 24. Motor 24 may be a permanent magnet type motor in which the polarity of the applied voltage determines the direction of rotation of the motor. Motor 24 drives suitable gears in gear box 25 which in turn drives variable condenser 16 to tank circuit 14.

Anode 13 of vacuum tube 10 is returned to ground through a small condenser 26 when switch 27 is closed. Condenser 26 is a small condenser effectively in parallel with large variable condenser 16.

A second motor 30 is caused to rotate with a constant velocity by the application of potential from a suitable source thereof designated herein as battery 31. The function of motor 30 is to actuate reversing switch 19 and also switch 27. When switch 27 is open, common poles 21 and 22 contact terminals 17 and 23, respectively, of reversing switch 19. When switch 27 is closed, common poles 21 and 22 contact terminals 33 and 18, respectively, of reversing switch 19.

Figure 2:
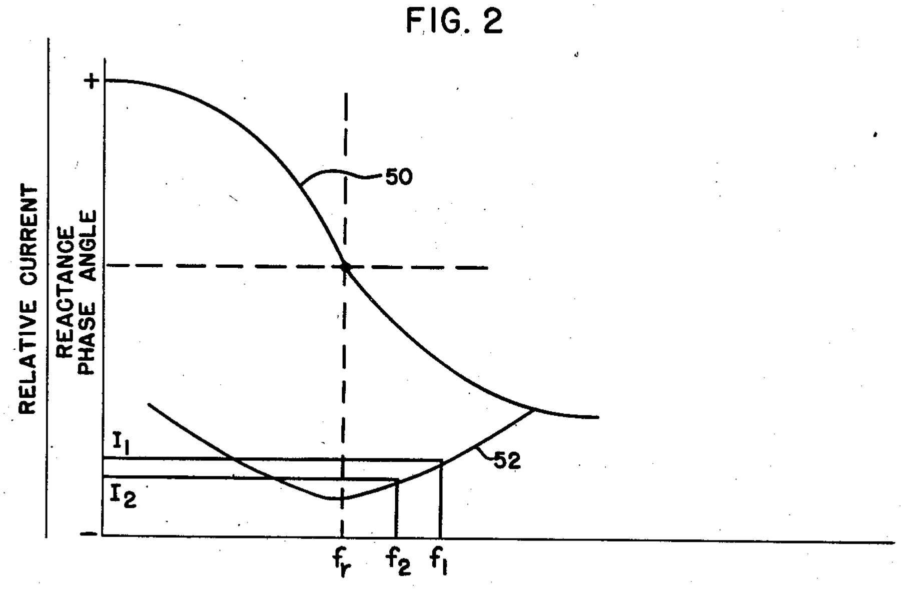
Fig. 2 is a graph which will be used in explaining the operation of the embodiment shown in Fig. 1.

To explain the operation of the embodiment shown in Fig. 1, reference will now be made to the graphs of Fig. 2. In graph 50 of Fig. 2 the phase angle of the reactance offered by the tank circuit 14 to an applied voltage is plotted against frequency. The desired resonant frequency $f_r$ of the tank circuit coincides with the radio frequency applied to vaccum tube 10 and therefore to the tank circuit. It is this frequency to which the tank circuit is to be tuned. At any frequency below the resonant frequency the phase angle of the tank circuit reactance is positive. At the resonant frequency, the phase angle is substantially zero and at the higher frequencies it becomes negative. Graph 52 of Fig. 2 shows the variation of line current through the tank circuit as a function of frequency. The current through the tank circuit is high at frequencies remote from the resonant frequency, and in the vicinity of the resonant frequency the current is minimum. The current variation is symmetric about the resonant frequency of the tank circuit.

Condenser 26, Fig. 1, is switched into and out of tank circuit 14 by means of motor 30, which is continuously operating. Motor 30 also operates the reversing switch 19. The reversing switch 19, when actuated, effects a reversal in the flow of current through the armature of motor 24 which is the plate current of vacuum tube 10.

Assume for the moment that switch 27 is open, and the adjustment of variable condenser 16 is such as to make the frequency to which tank circuit 14 is tuned be equal to a frequency, $f_1$, above the resonant frequency. It is intended that the apparatus will alter the adjustment of variable condenser 16 so that tank circuit 14 becomes resonate at the frequency $f_r$. Corresponding to the frequency $f_1$, there is a direct current $I_1$ (of one polarity) flowing through tank circuit 14 and also through motor 24.

As motor 30 rotates, switch 27 is closed and reversing switch 19 reverses the polarity of the current flowing through D.-C. motor 24. When the small capacitor 26 is shunted across the tank circuit, the frequency to which the tank circuit is tuned is reduced slightly to a value $f_2$. Corresponding to the frequency $f_2$, there now flows through the tank circuit and also through D.-C. motor 24 a direct current $I_2$ of opposite polarity with respect to current $I_1$. When the frequency $f_2$ is above the resonant frequency as in this example, the direct current $I_1$ is greater than the direct current $I_2$. Therefore, over a complete cycle, a net direct current flows through motor 24 of the same polarity as direct current $I_1$. Direct-current motor 24 therefore rotates in one direction to reduce the value of the capacitance of variable capacitor 16.

When tank circuit 14 is tuned substantially to the desired resonant frequency $f_r$, the difference between the plate currents $I_2$ and $I_1$ is substantially zero; hence there is no net direct current over a complete cycle to operate motor 24. Consequently motor 24 stops and variable condenser 16 is thereby adjusted for the correct tuning of the tank circuit to the radio frequency which is applied thereto.

If the value of the variable condenser 16 had initially been too low to allow the tank circuit to be resonant at the frequency $f_r$, the motor would have rotated in the opposite direction to increase the capacitance to the desired value.

Switch 27 and reversible switch 19 may be incorporated in a commutator which is driven by motor 30. It should be obvious to those skilled in the art that the circuit shown in Fig. 1 could be altered to fit particular circumstances and still not depart from the scope of the invention.

Figure 3:
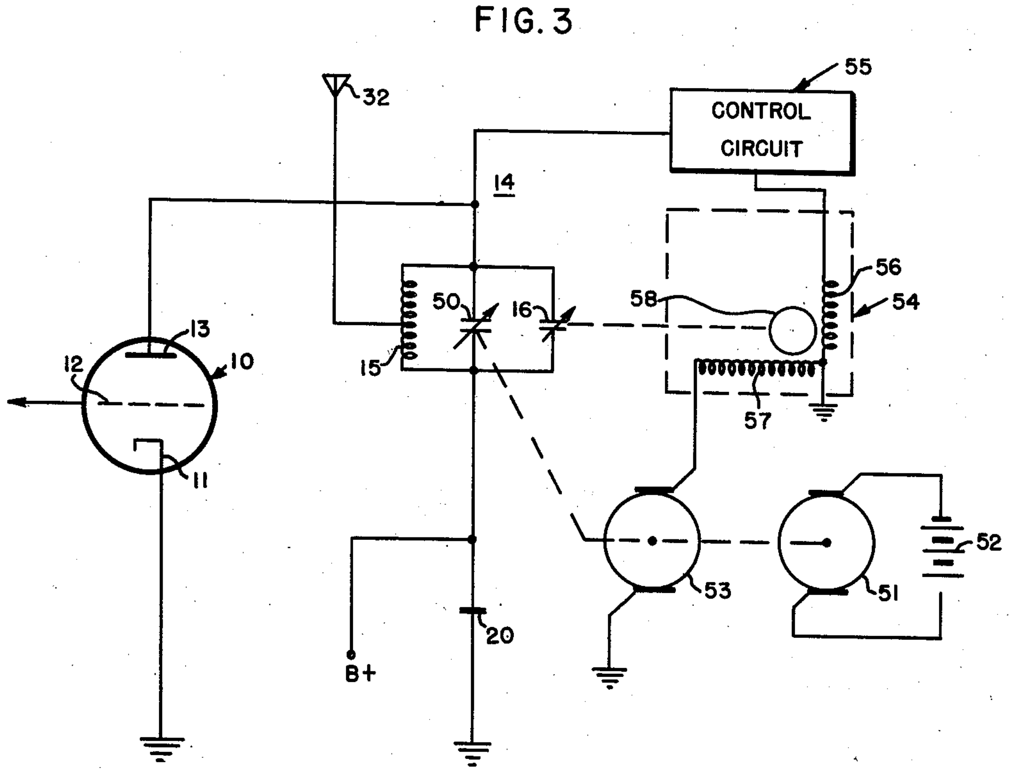
Fig. 3 is a schematic diagram of a second embodiment of electrical apparatus entailing the principles of this invention.

A second embodiment of this invention which will vary the tuning of the resonant tank circuit continuously between two values and simultaneously monitor the change in current produced therein is shown in Fig. 3.

In Fig. 3 a portion of the output circuit of a radio frequency transmitter is shown, vacuum tube 10 being in the output stage. Control grid 12 receives the output from a preceding stage, such as the modulator, in the transmitter. Cathode 11 of vacuum tube 10 is at ground potential.

Anode 13 of vacuum tube 10 is connected to one end of a tank circuit 14. Tank circuit 14 includes a center-tapped inductance 15 in parallel with a variable condenser 16. The center tap of inductance 15 is connected to a suitable radiating means, designated herein as antenna 32. The opposite end of tank circuit 14 is returned through a bypass condenser 20 to ground potential and also to a suitable source of positive potential, designated herein as B+. Elements designated in Figs. 1 and 3 with like reference numerals are identical in function and purpose.

A small variable condenser 50 is connected in parallel with main tuning condenser 16. Variable condenser 50 is rotated by motor 51 which receives its driving voltage from a suitable source of potential, designated herein as battery 52. The resonant frequency of tank circuit 14 will therefore periodically vary about a center frequency determined by the setting of tuning condenser 16. A.-C. generator 53 is driven in synchronism with the rotation of variable condenser 50 by the same motor 51. Thus, it will be seen that the phase of the output of generator 53 is indicative of the angular position of variable condenser 50. The output of generator 53, constituting a reference signal, is applied to driving circuit 54.

A radio frequency signal is taken from the tank circuit 14 and applied to a control circuit 55. This signal will, of course, have the same frequency as the input at control electrode 12 of tube 10, i. e., $f_r$, but will vary periodically in amplitude in accordance with the rotation of variable condenser 50, due to the change in the resonant frequency of tank circuit 14 relative to $f_r$. Thus, the variations in amplitude are caused by the signal moving along the resonance curve of tuned circuit 14. The control circuit 55 rectifies these radio frequency output signal variations to produce in its output an A.-C. control signal of the same frequency as said reference signal. However, the phase of the control signal is dependent upon which side of the resonant frequency, $f_r$, the resonant circuit is tuned to. Control circuit 55 may be any well known circuit which will obtain the fundamental A.-C. component of the variation of D.-C. plate current that flows through the tank circuit 14, or any variable associated with the tuning conditions such as a detector having a filter in its output for separating the fundamental A.-C. component.

By initially setting generator 53, the reference signal and the control signal can be phased such that they are in phase on one side of the resonant frequency, out of phase on the other side of the resonant frequency $f_r$. The fundamental component of the control signal will go through zero when the resonant frequency is equal to $f_r$, due to the symmetry of the resonance curve. This action can be utilized in driving circuit 54 to shift the tank circuit tuning in such a way that its resonant frequency approaches $f_r$.

Driving circuit 54 may include a fixed coil 56 which receives the control signal. Fixed coil 57 is placed at right angles to fixed coil 56 and receives the reference signal from generator 53. Armature 58 of driving circuit 54, which is located in the field produced by fixed coils 56 and 57, will experience a counterclockwise or a clockwise torque depending upon the relative phase of the control signal and the reference signal. The torque is utilized to turn the rotor of the tuning condenser 16 in the proper direction.

The tank circuit 14 included in the embodiments described above may comprise a fixed condenser and a variable inductance for tuning and another for periodically detuning the tank circuit. The value of inductance of a variable inductance coil may be adjusted by the movement of an iron dust core into or out of the center of the coil.

While there have been described what are at present considered to be the preferred embodiments of this invention, it will be obvious to those skilled in the art that various changes and modifications may be made therein without departing from the scope of the invention.

The invention claimed is:

1. The combination, a tunable tank circuit, a signal source having a frequency in the vicinity of the resonant frequency of said tank circuit, means for applying said signal source to said tank circuit, a small fixed reactance, a first switch means connected in series with said reactance, means connecting said serially connected reactance and first switch means in circuit with said tank circuit, means for periodically opening and closing said first switch means, a reversible direct current motor mechanically coupled to said tank circuit to effect a tuning of the resonant frequency thereof in either direction, means coupled to said tank circuit for deriving unidirectional electrical energy having a magnitude which is a function of the frequency differences between said frequency of said signal source and the resonant frequency of said tank circuit, and a second switch means operated in synchronism with the opening and closing of said first switch means for applying said energy directly to said motor in one direction during the intervals said first switch means are open and in the other direction during the intervals said first switch means are closed.

2. In combination, an electron discharge device having at least a cathode, an anode and a control electrode, a tunable parallel resonant circuit, means connecting one end of said circuit to said anode, means for applying a signal having a frequency in the vicinity of the resonant frequency of said circuit to said control electrode, a reversible direct current motor, a multi-pole, multi-throw first switch, means connecting said motor across the common terminals of said first switch, means connecting the other end of said circuit to both a first pole of a first throw and a second pole of a second throw of said first switch, a source of direct current potential, means connecting the negative terminal of said source to said cathode, means connecting the positive terminal of said source to both the second pole of said first throw and the first pole of said second throw of said first switch, means mechanically coupling said motor to said circuit to effect a tuning of the resonant frequency thereof in either direction, a small reactance, a second switch serially connected to said reactance, means connecting said serially connected reactance and second switch across said circuit, and means for periodically opening and closing said second switch and in synchronism therewith throwing said first switch between said first and second throws.

JOHN M. HOLLYWOOD.

REFERENCES CITED

The following references are of record in the file of this patent:

UNITED STATES PATENTS

| Number | Name | Date |
|---|---|---|
| 1,530,169 | Grimes | Mar. 17, 1925 |
| 1,620,204 | Heising | Mar. 8, 1927 |
| 1,626,724 | Demarest et al. | May 3, 1927 |
| 2,105,096 | Peterson | Jan. 11, 1938 |
| 2,280,019 | Alexanderson et al. | Apr. 14, 1942 |
| 2,379,689 | Crosby | July 3, 1945 |
| 2,380,947 | Crosby | Aug. 7, 1945 |
| 2,380,948 | Crosby | Aug. 7, 1945 |
| 2,404,568 | Dow | July 23, 1946 |
| 2,415,799 | Reifel et al. | Feb. 11, 1947 |